(12) United States Patent
Hayashi (10) Patent No.: US 11,689,211 B2
(45) Date of Patent: Jun. 27, 2023

(54) ANALOG-TO-DIGITAL CONVERTER (71) Applicant: SANKEN ELECTRIC CO., LTD., Niiza (JP)

(72) Inventor: Hideki Hayashi, Niiza (JP)

(73) Assignee: SANKEN ELECTRIC CO., LTD., Niiza (JP)

(*) Notice: Subject to any disclaimer, the term of this patent is extended or adjusted under 35 U.S.C. 154(b) by 63 days.

(21) Appl. No.: 17/563,109

(22) Filed: Dec. 28, 2021

(65) Prior Publication Data
US 2022/0123761 A1 Apr. 21, 2022

Related U.S. Application Data (63) Continuation of application No. PCT/JP2019/026856, filed on Jul. 5, 2019.

(51) Int. Cl.
H03M 1/12 (2006.01)
H03M 1/46 (2006.01)

(52) U.S. Cl.
CPC .................. H03M 1/466 (2013.01)

(58) Field of Classification Search
CPC ...... H03M 1/468; H03M 1/765; H03M 1/804; H03M 1/38; H03M 1/06; H03M 1/46; H03M 1/02; H03M 1/0678; H03M 1/1019; H03M 1/1047; H03M 1/144; H03M 1/462; H03M 1/68; H03M 1/687; H03M 1/001; H03M 1/0682; H03M 1/069;
(Continued)

(56) References Cited

U.S. PATENT DOCUMENTS 4,200,863 A * 4/1980 Hodges ............... H03M 1/38
341/172
4,350,975 A * 9/1982 Haque ............... H03M 1/06
341/172

(Continued)

FOREIGN PATENT DOCUMENTS

JP H4-129332 A 4/1992
JP 2002-374169 A 12/2002
JP 2005-295315 A 10/2005

OTHER PUBLICATIONS

International Search Report of PCT/JP2019/026856 dated Sep. 24, 2019.

*Primary Examiner* — Linh V Nguyen
(74) *Attorney, Agent, or Firm* — Metrolex IP Law Group, PLLC (57) ABSTRACT An analog-digital conversion circuit is disclosed for comparing a comparison potential with a reference potential generated based on a reference power supply to convert a comparison potential to a digital value. An analog-to-digital converter generates the comparison potential based on a sampled and held input potential, the digital value, and the reference power supply. A current amount control unit controls current amount flowing to the current amount control element in each bit circuit. In response to second switches of the bit circuits being turned on in order from the upper bit in each bit circuit by the digital value, the current amount control unit applies a current control potential to the current amount control element in any of the bit circuits that the noise current is more than allowable value while the noise current proportional to the charge flowing from the capacitor is more than the allowable value.

6 Claims, 10 Drawing Sheets

(58) Field of Classification Search
CPC ............. H03M 1/1014; H03M 1/1038; H03M 1/1215; H03M 1/129; H03M 1/162; H03M 1/203; H03M 1/206; H03M 1/34; H03M 1/44; H03M 1/466; H03M 1/662; H03M 1/74
USPC ................. 341/118–121, 154, 155, 158, 172
See application file for complete search history.

(56) References Cited

U.S. PATENT DOCUMENTS

| | | | | |
|---|---|---|---|---|
| 5,675,340 | A * | 10/1997 | Hester | H03M 1/06 341/172 |
| 6,130,635 | A * | 10/2000 | Jones, III | H03M 1/06 341/172 |
| 7,830,295 | B2 * | 11/2010 | Ikeda | H03K 5/2472 341/172 |
| 7,928,871 | B2 * | 4/2011 | Aruga | H03M 1/1047 341/172 |
| 8,766,833 | B1 * | 7/2014 | Bogner | H03M 1/1014 341/120 |
| 8,860,599 | B1 * | 10/2014 | Lien | H03M 1/462 341/158 |
| 2002/0190887 | A1 | 12/2002 | Takata et al. | |
| 2003/0234736 | A1 * | 12/2003 | Tachibana | H03M 1/68 341/172 |
| 2005/0146456 | A1 | 7/2005 | Kondo | |
| 2010/0188277 | A1 * | 7/2010 | Aruga | H03M 1/1215 341/158 |
| 2010/0271245 | A1 | 10/2010 | Thomas et al. | |
| 2011/0234433 | A1 * | 9/2011 | Aruga | H03M 1/06 341/172 |
| 2019/0068179 | A1 | 2/2019 | Chen et al. | |

\* cited by examiner

ANALOG-TO-DIGITAL CONVERTER

CROSS REFERENCE TO RELATED APPLICATIONS

This application is a continuation application of International Application No. PCT/JP2019/026856, filed on Jul. 5, 2019, the entire contents of which are incorporated herein by reference.

BACKGROUND

The disclosure relates to a successive approximation type analog-to-digital (A/D) conversion circuit.

Figure 13:
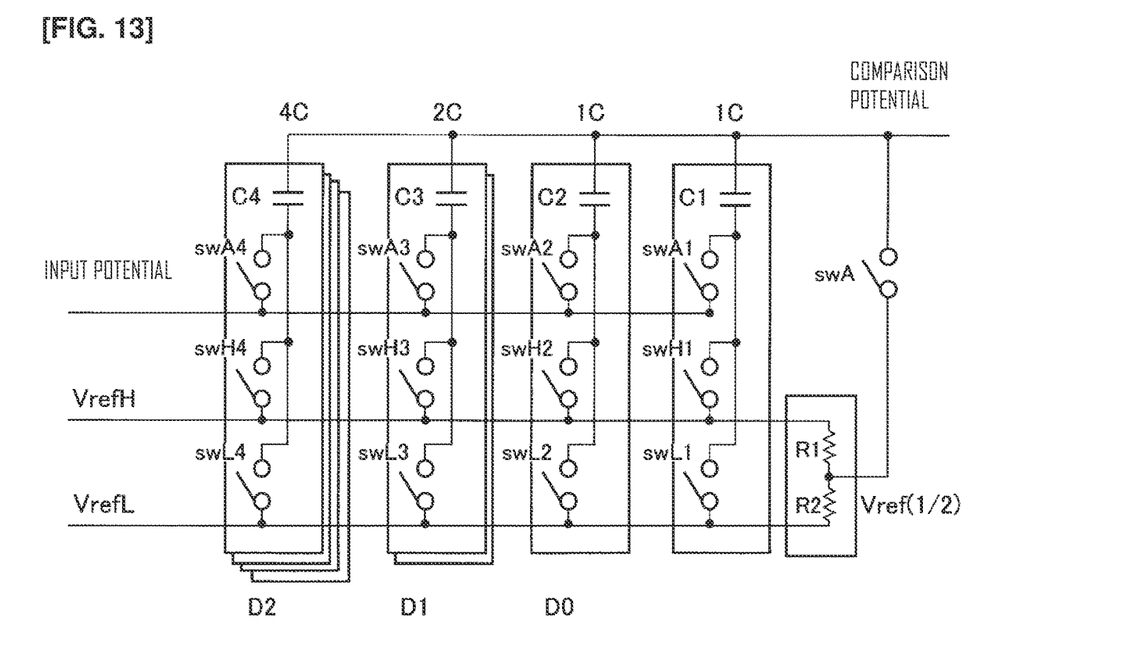
FIG. 13 is a diagram illustrating a configuration of the CDAC according to a related art.
Figure 14:
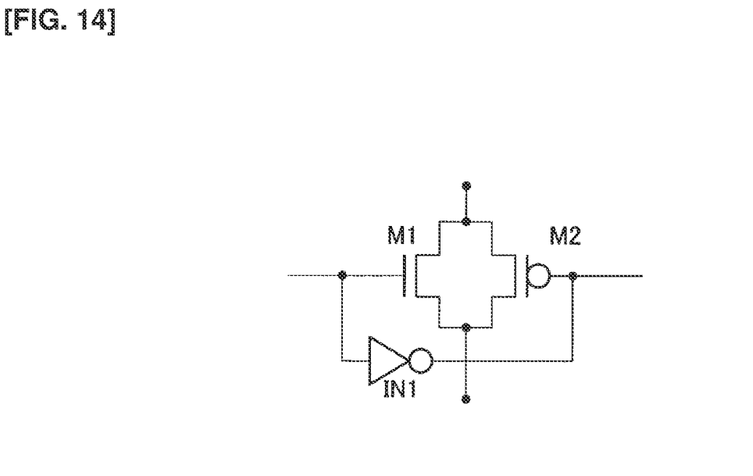
FIG. 14 is a diagram illustrating a configuration of each switch in the CDAC according to the related art.

As an A/D conversion circuit, a successive approximation type A/D conversion circuit using an analog-to-digital converter with a capacitance for generating a comparison potential (hereinafter referred to as a CDAC) is known. As illustrated in FIG. 13, the CDAC comprises: capacitors C1 to C4 whose capacitance values are weighted to $2^n C$, such as 1 C, 2 C, and 4 C; switches swA1 to swA4; switches swH1 to swH4; switches swL1 to swL4; a reference power supply (VrefH/VrefL); and a series circuit including a resistor R1 and a resistor R2 that generate a ½ potential of the reference power supply. Each of the switches swA1 to swA4, switches swH1 to swH4, and switches swL1, swL2, swL3, and swL4, as illustrated in FIG. 14, is an analog switch comprising MOS-FETM1, MOS-FETM2, and an inverter IN1.

Figure 15:
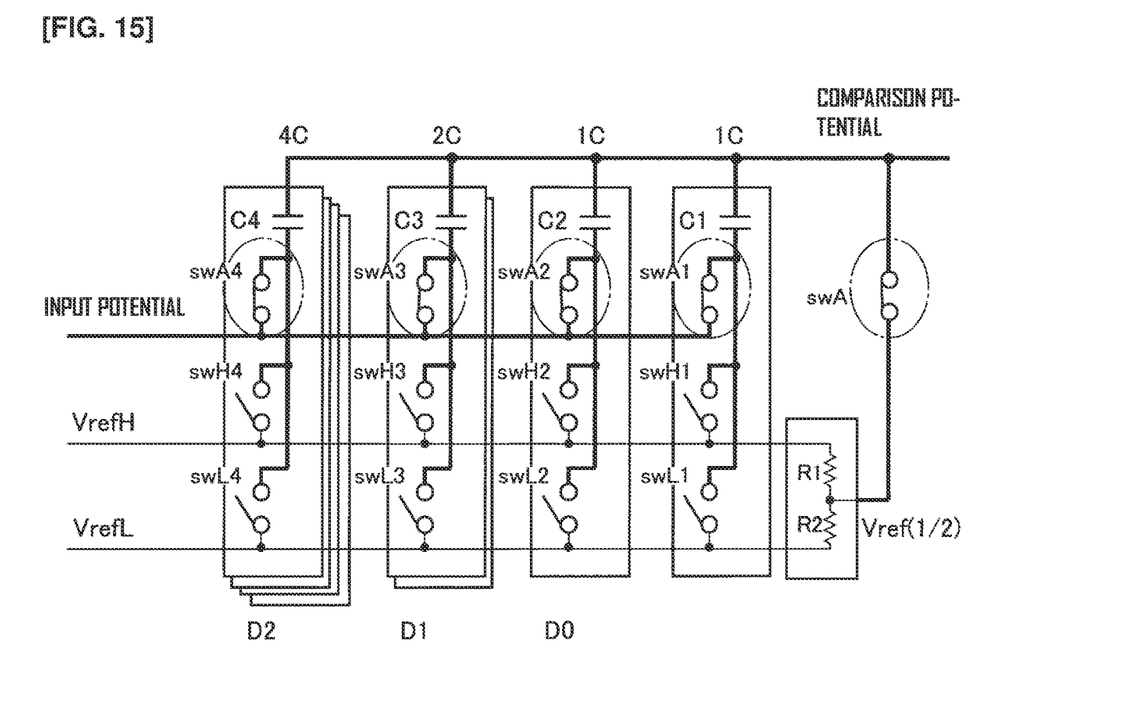
FIG. 15 is a diagram illustrating a sampling operation of an input potential when the switch of the CDAC is turned on according to the related art.

The CDAC is, for example, includes 3-bit bit circuits D2, D1, and D0. The switches swA1 to swA4 illustrated in FIG. 15 are turned on to input an input potential to the CDAC. The operation of inputting the input potential is called the "sampling operation". The input potential and the comparison potential are connected via the capacitors C4 to C1 illustrated in 4 C, 2 C, 1 C, and 1 C at the time of the operation. A charge resulting from the difference between the input potential and the comparison potential is stored in the capacitors C4, C3, C2, and C1.

Figure 16:
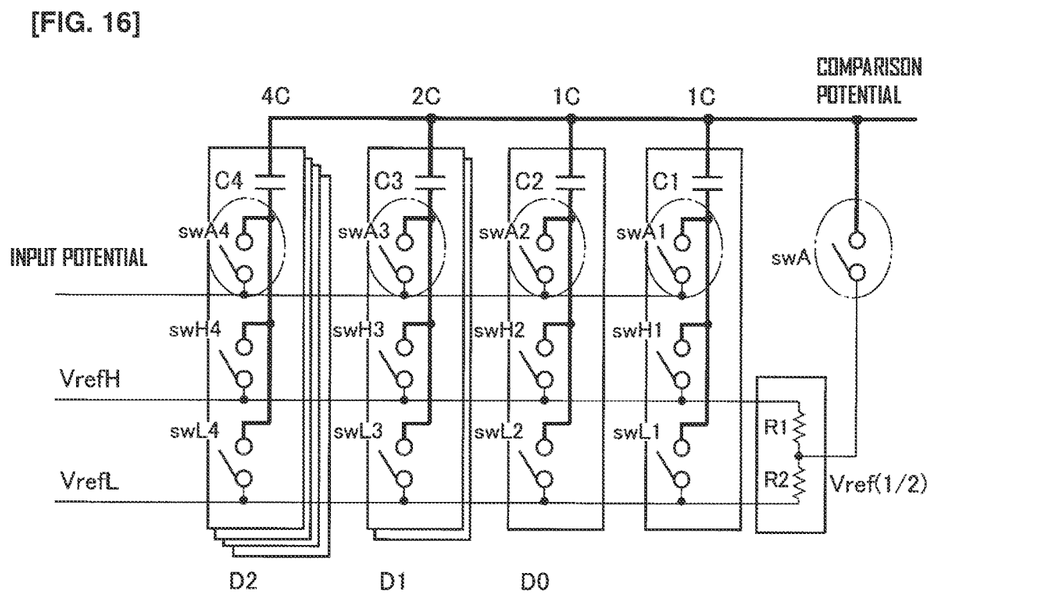
FIG. 16 is a diagram illustrating a hold operation of a charge stored in a capacitor of the CDAC according to the related art.

Due to the charge stored in the capacitors C4 to C1, even if the switches swA1 to swA4 are turned off, a potential of a node illustrated by a thick solid line in FIG. 16 is preserved. This operation is called "hold operation".

Figure 17:
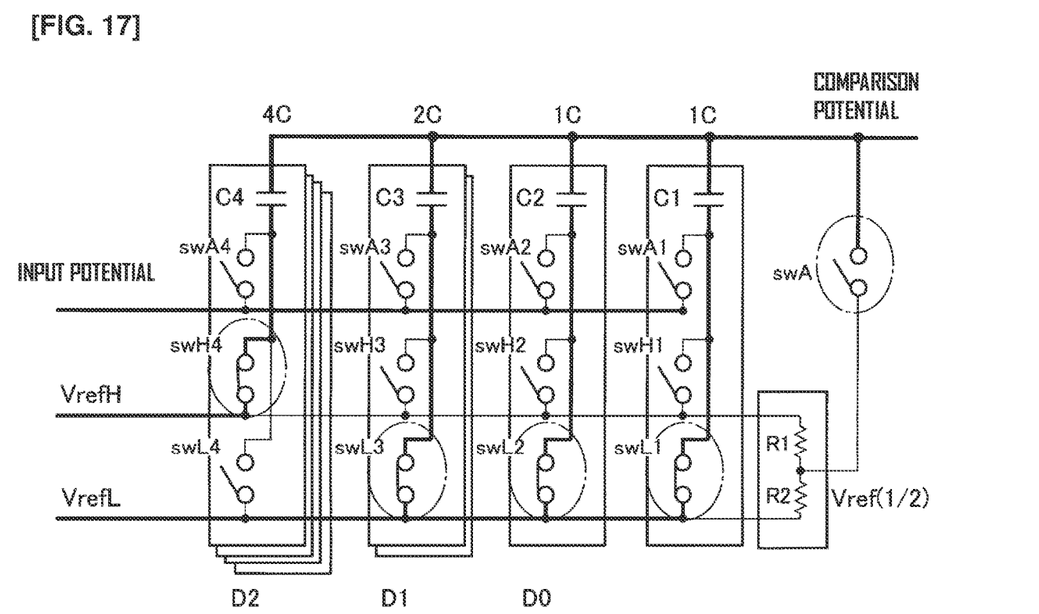
FIG. 17 is a diagram illustrating a result of an analog-to-digital conversion of the CDAC according to the related art.

As illustrated in FIG. 17, the switches swH1, swH2, swH3, and swH3 installed in each of the bit circuits D2, D1, and D0, respectively, are turned off, and the switch swH4 is turned on. Also, the switches swL1, swL2, swL3, and swL3 are turned on, and the switch swL4 is turned off. The comparison potential is observed when the reference power supply VrefH or VrefL is applied to the capacitors C1, C2, C3, and C4.

A combination of turned on switches is tried, and a search is made for a combination of switches whose comparison potential matches the ½ potential of the reference power supply during the sampling operation. For example, when a comparator turns on the switch swH4 of the bit circuit D2, the switch swL3 of the bit circuit D1, and the switch swL2 of the bit circuit D0, the comparison potential is compared with a reference potential, which is a ½ potential of the reference power supply Vref. When the comparison potential is the reference potential, which is a ½ potential of the reference power supply Vref, the comparator indicates that a digital value corresponding to an input potential is 100 (binary number). That is, the bit circuit D2 outputs "1", the bit circuit D1 outputs "0", and the bit circuit D0 outputs "0", which is the conversion result of the A/D conversion circuit.

A related technology may be disclosed in JPH04-129332 (Patent Document 1).

In order to reduce an error in the A/D conversion circuit, it is necessary to reduce the error in an output potential of the CDAC. In order to reduce the error in the output potential of the CDAC, the reference power supplies VrefH and VrefL need to be the intended correct potentials. The CDAC is designed to inject a noise current into the reference power supply during operation. When the noise current is injected to the reference power supply, a shift of the impedance of the reference power supply×noise current=noise voltage is generated in the reference power supply, which causes an error in the A/D conversion circuit.

SUMMARY

An A/D conversion circuit according to one or more embodiments may include an analog-to-digital converter that generates a comparison potential based on a potential with a sampled and held input potential, a digital value, and a reference power supply. An A/D conversion circuit according to one or more embodiments may compare the comparison potential with a reference potential generated based on the reference power supply to convert the comparison potential into the digital value, and output the converted digital value to the analog-to-digital converter.

An analog-digital conversion circuit according to one or more embodiments for comparing a comparison potential with a reference potential generated based on a reference power supply to convert a comparison potential to a digital value, and outputting the digital value to an analog-to-digital converter that may include: the analog-to-digital converter that generates the comparison potential based on a potential that is sampled and held input potential, the digital value, and the reference power supply, the analog-to-digital converter including: bit circuits, each bit circuit corresponding to a bit of bits, the bit circuits including: a capacitor that receives the comparison potential from a first terminal, and capacitance value increases from low-order bit to high-order bit of the bits; a first switch to which the input potential is applied at a second terminal of the capacitor; a second switch that is electrically connected with the second terminal of the capacitor and the reference power supply; and a current amount control element; wherein the capacitor, the first switch, the second switch, and the current amount control element are connected in series; and a current amount control unit that controls current amount flowing to the current amount control element in each bit circuit of the bit circuits. In one or more embodiments, in response to second switches of the bit circuits being turned on in order from an upper bit in each bit circuit by the digital value, the current amount control unit may apply a current control potential to the current amount control element in any of the bit circuits that a noise current is more than allowable value while the noise current proportional to a charge flowing from the capacitor to the reference power supply is more than the allowable value.

BRIEF DESCRIPTION OF DRAWINGS

FIG. 8 is a diagram illustrating a constant current control potential applied to the current amount control element for a certain period of time with a switch turned on;

DETAILED DESCRIPTION

An A/D conversion circuit according to one or more embodiments is explained below with reference to drawings.

First Embodiment

Figure 1:
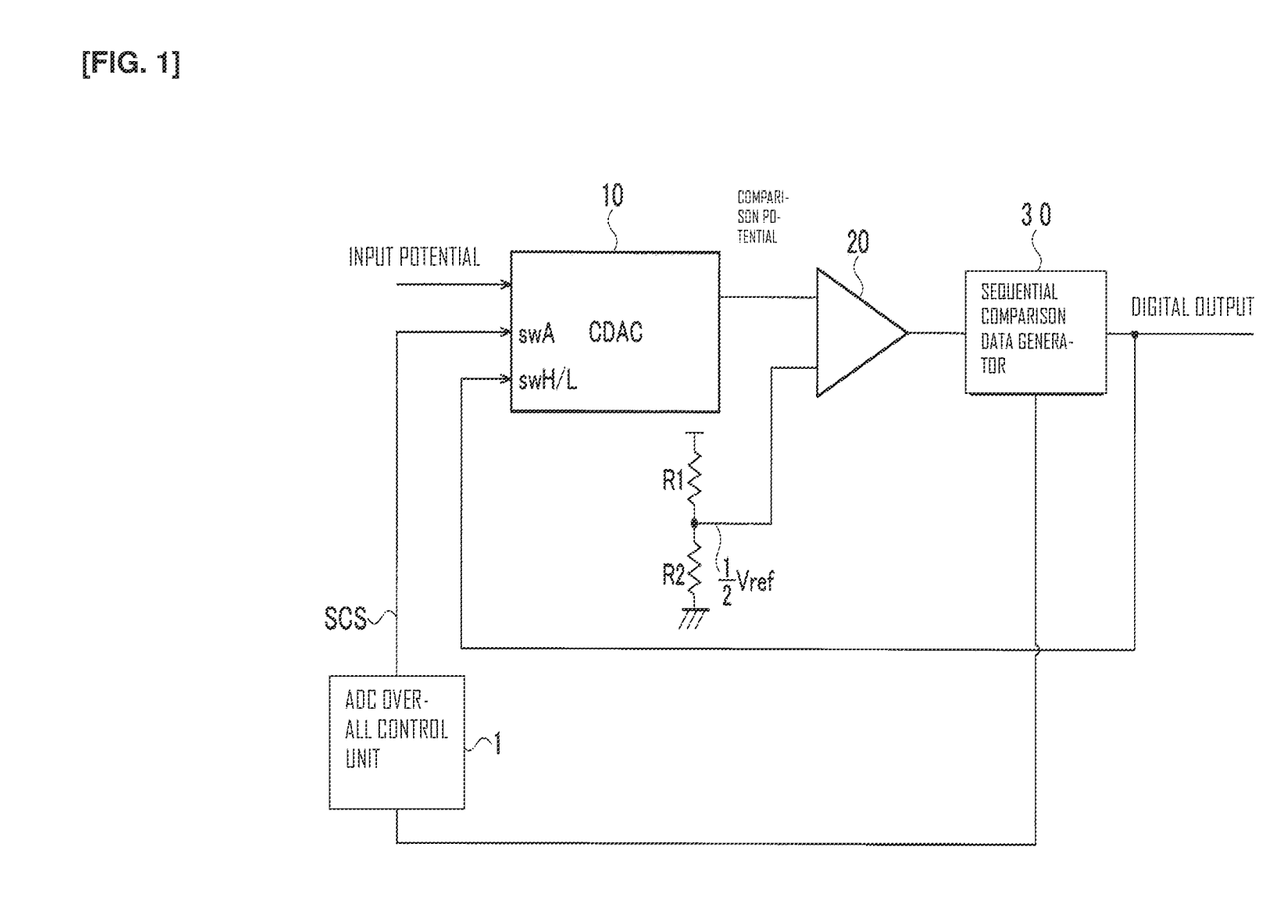
FIG. 1 is an overall configuration diagram illustrating an A/D conversion circuit according to a first embodiment.

FIG. 1 is an overall configuration diagram illustrating an A/D conversion circuit according to a first embodiment. The A/D conversion circuit comprises an ADC overall control unit 1, a CDAC 10, a comparator 20, and a sequential type comparison data generator 30.

The ADC overall control unit 1 controls the entire ADC and outputs a sampling control signal SCS to switch swA including switches swA1, swA2 swA3, and swA4 (Not shown in FIG. 1) of the CDAC 10. The CDAC 10 samples an input potential and generates a comparison potential based on a potential held in a capacitor, a digital value, and a potential of a reference power supply Vref.

The comparator 20 compares the comparison potential from the CDAC 10 and a reference potential ½ Vref generated based on the reference power supply Vref, and converts the comparison potential into a digital value. The sequential type comparison data generator 30 stores the digital value converted by the comparator 20 in a register (not illustrated in figures), and outputs the digital value stored in the register to the CDAC 10 as switch signals swH and swL.

Figure 2:
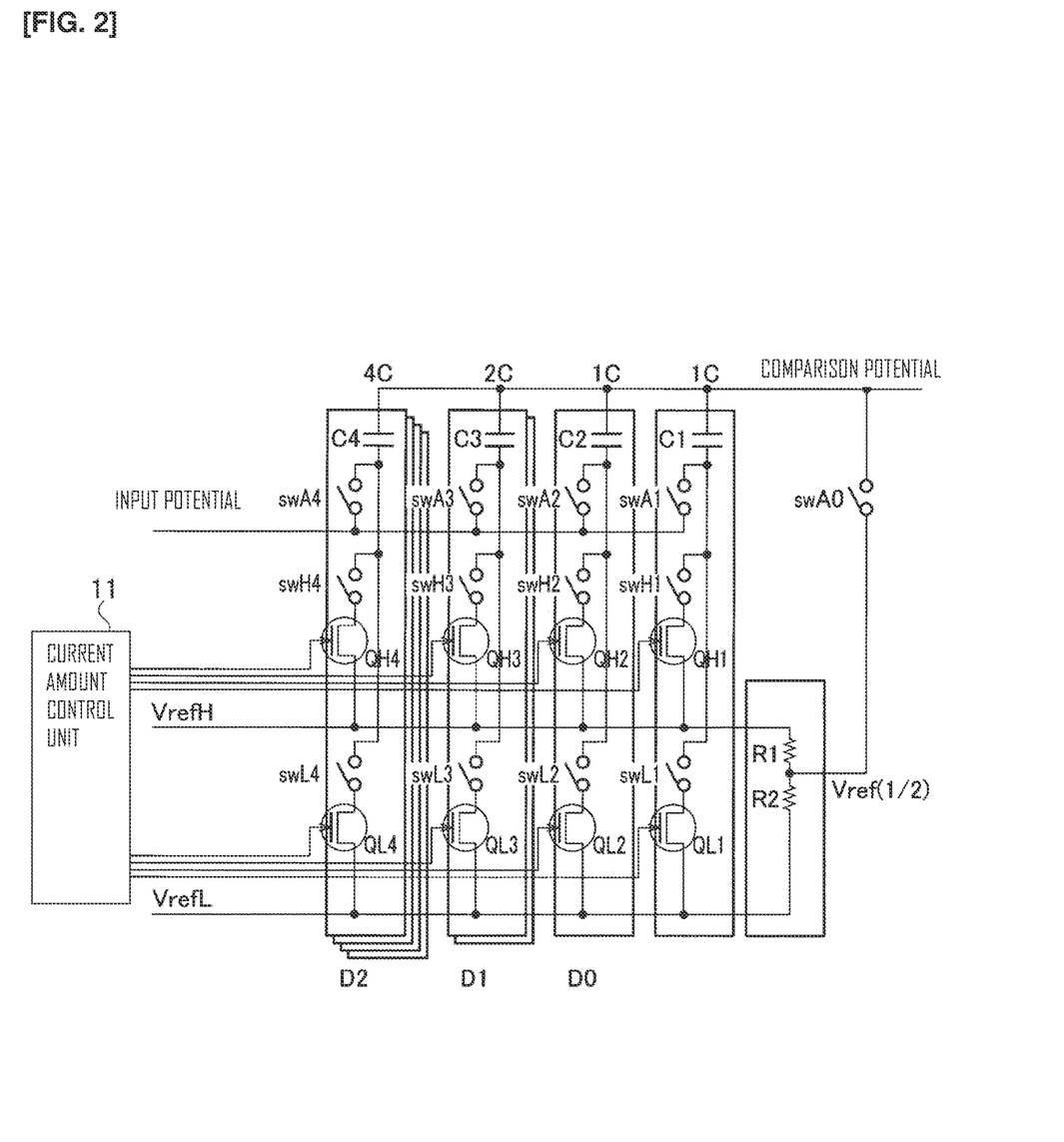
FIG. 2 is a configuration diagram illustrating a CDAC in the A/D conversion circuit according to a first embodiment.

FIG. 2 is a configuration diagram illustrating a CDAC in the A/D conversion circuit according to a first embodiment. The A/D conversion circuit is a successive approximation type A/D conversion circuit using a CDAC including a capacitance for generating a comparison potential.

The CDAC has a feature to include switches swH1 to swH4 and current amount control elements QH1 to QH4 provided between capacitors C1 to C4 and a reference power supply VrefH, and switches swL1 to swL4 and current amount control elements QL1 to QL4 provided between the capacitors C1 to C4 and a reference power supply VrefL in addition to the CDAC in FIG. 13.

For each of the capacitors C2 to C4, the comparison potential is output to one end, and a capacitance value increases as bits become higher from the low-order bits to the high-order bits. For the switches swA1 to swA4, an input potential is applied to the other end of each of the capacitors C1 to C4.

The CDAC includes a bit circuit D2 including the capacitor C4, the switch swH4, the current amount control element QH4, and a switch swL4, and the current amount control element QL4; a bit circuit D1 including the capacitor C3, the switch swH3, the current amount control element QH3, the switch swL3, and the current amount control element QL3; and a bit circuit D0 including the capacitor C2, the switch swH2, the current amount control element QH2, the switch swL2, and the current amount control element QL2.

A current amount control unit 11 controls the amount of current flowing in the current amount control elements QH1 to QH4 and QL1 to QL4. The current amount control elements QH1 to QH4 and QL1 to QL4 are made of MOSFETs, for example. The current amount control elements QH1 to QH4 and QL1 to QL4 are also referred to as current amount control elements Q1 to Q4.

The switches swH1 to swH4 and swL1 to swL4 are input with a digital value 1 or 0 from the sequential comparison data generator 30, and turned on with the digital value 1 and turn off with the digital value 0.

When the switches are turned on in order of the high-order bits, which is in the order of the switches swH4, swH3 swH2, and swH1 (in the order of the switches swL4, swL3, swL2, swL1), in each of the bit circuits D2, D1, and D0, the current amount control unit 11 controls a noise current to be less than an allowable value for one of the bit circuits D2, D1, and D0, in which the noise current proportional to a charge flowing to the reference power supply VrefH (VrefL) from the capacitors C4, C3, C2, and C1 exceeds the allowable value. For example, during the period when the switch swH4 (swL4) in the bit circuit D2 is turned on, a current control potential is applied to the current amount control element QH4 (QL4) to limit the noise current to be less than the allowable value.

In order not to limit the current amount, the current amount control unit 11 turns on the current amount control element QH4 (QL4) during the period when one of the switches swH3 and swH2 (the switches swL3 and swL2) in the bit circuits D1 and D0, except for the bit circuit D2, is turned on.

Figure 3:
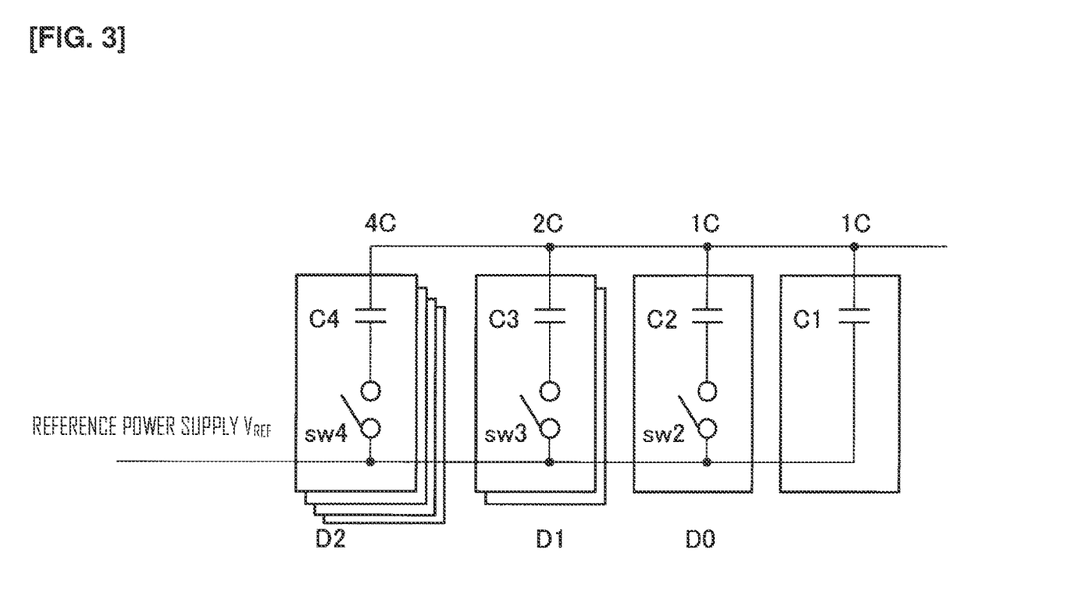
FIG. 3 is a diagram illustrating a bit circuit in which a series circuit of a capacitor and a switch provided between a reference power supply and a comparison potential of the CDAC of a first embodiment is provided for each bit.
Figure 4:
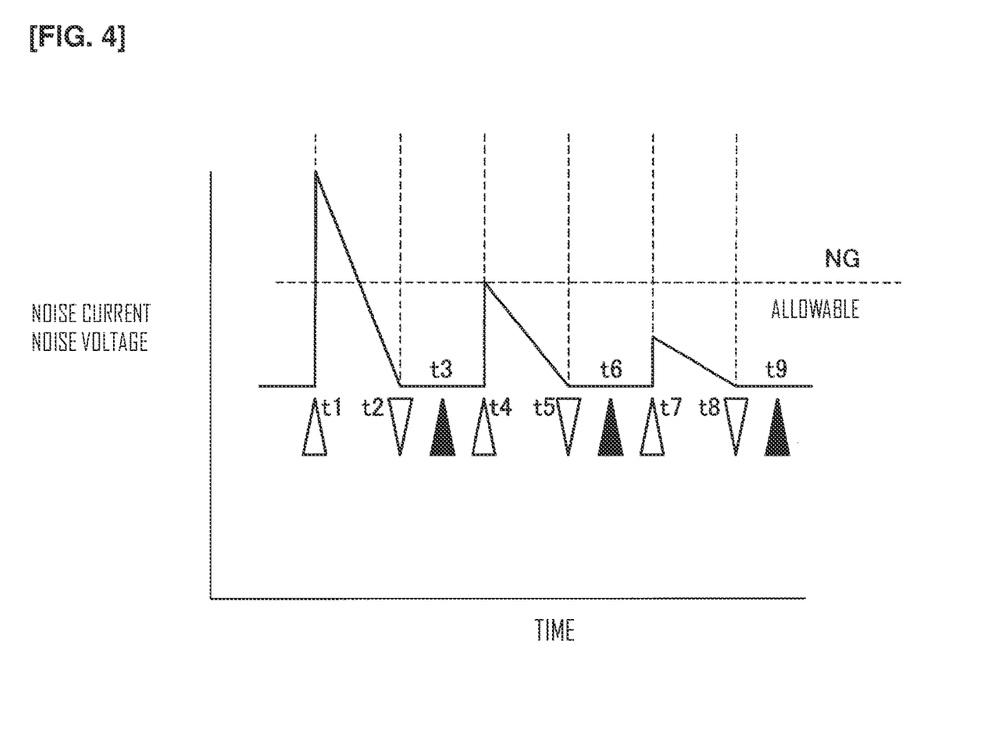
FIG. 4 is a diagram illustrating a temporal alteration of a noise current proportional to a charge flowing from the capacitor to the reference power supply when switches are turned on in order of the high-order bits in each bit circuit illustrated in FIG. 3, for example.

FIG. 3 illustrates a bit circuit in which a series circuit of the capacitors C4 to C2 and switches sw4 to sw2 provided between the reference power supply Vref and the comparison potential is provided for each bit. FIG. 4 illustrates a temporal alteration of the noise current proportional to a charge flowing to the reference power supply Vref from the capacitors C4, C3, and C2 when switches sw4, sw3, and sw2 are turned on, starting from the bit circuit of the high-order bit.

An operation of the successive approximation type A/D conversion circuit is to operate the CDAC and repeat a process of comparing the comparison potential with the reference potential and of determining the next digital value of the CDAC. In the successive approximation type A/D conversion circuit, the digital value is obtained from the high-order bits (large value); therefore, when considering the noise of the reference power supply, it may be suitable to apply a model, in which switches sw4, sw3, and sw2 illustrated in FIG. 3 are turned on in that order.

When the switches sw4, sw3, and sw2 are turned on in that order, charges of 4 C, 2 C, and 1 C flow from the capacitors C4, C3, and C2 to the reference power supply Vref. In the worst case model of CDAC, the charge amount of 4 C, 2 C, and 1 C is 4:2:1.

If the amount of charge flowing into the reference power supply Vref and the noise current are in proportional relationship, the noise current (noise voltage) is 4 when the switch sw4 is turned on, the noise current (noise voltage) is 2 when the switch sw3 is turned on, and the noise current (noise voltage) is 1 when the switch sw2 is turned on. Therefore, the operation of the high-order bits may be focused to reduce the noise.

FIG. 4 illustrates a case in which the noise current exceeds the allowable value. At a time t1, when the switch sw4 of the high-order bit is turned on, the noise current flows beyond the allowable value and reaches zero at a time t2. At a time t3, a potential comparison is made between the comparison potential and the reference potential. At a time t4, when the switch sw3 is turned on, the noise current flows below the allowable value and reaches zero at a time t5.

At a time t6, a potential comparison is made between the comparison potential and the reference potential. At a time t7, when the switch sw2 is turned on, the noise current flows below the allowable value and reaches zero at a time t8. At a time t9, a potential comparison is made between the comparison potential and the reference potential.

Thus, when the switch sw4 of the high-order bit is turned on, the noise current exceeds the allowable value, and the noise error becomes large. Therefore, the current amount control elements Q4, Q3, and Q2 are provided between the switches sw4, sw3, and sw2 and the reference power supply Vref as illustrated in FIG. 5.

Figure 5:
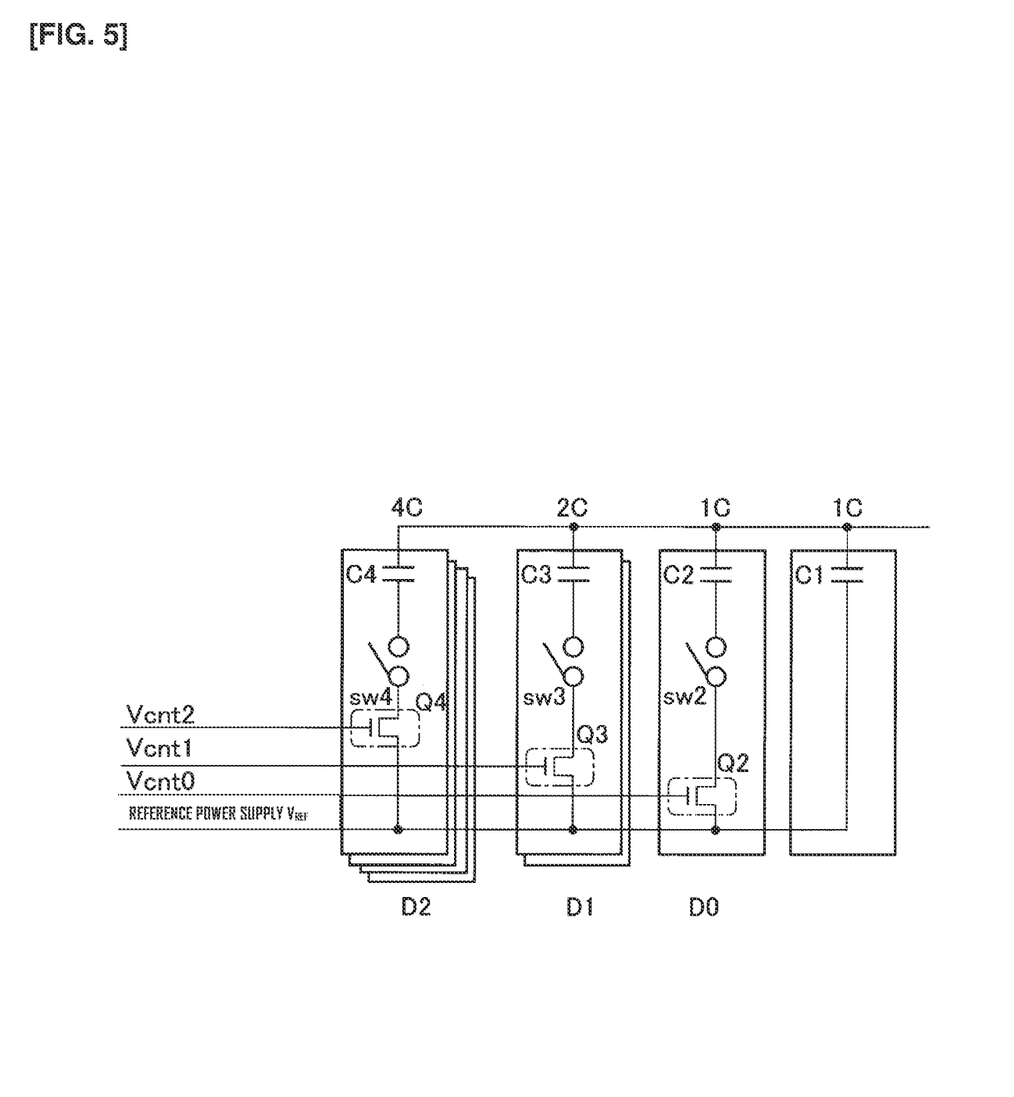
FIG. 5 is a diagram illustrating bit circuits with a series circuit of a switch and a current amount control element provided between the capacitor and the reference power supply.

As illustrated in FIG. 5, the current amount control unit 11 controls the noise current from the capacitor C4 to be less than the allowable value by applying a current control potential to the current amount control element Q4 during the period when the switch sw4 is turned on in the bit circuit D2, in which the noise current proportional to the charge flowing from the capacitors C4, C3, and C2 to the reference power supply Vref exceeds the allowable value (time t11 to time t13 illustrated in FIG. 6), when the switches sw4, sw3, and sw2 are turned on in order of the high-order bits.

The above-mentioned method may keep the noise current to the reference power supply Vref below the allowable value. That is, an A/D/conversion circuit, which reduces the noise voltage and error, may be provided.

Figure 6:
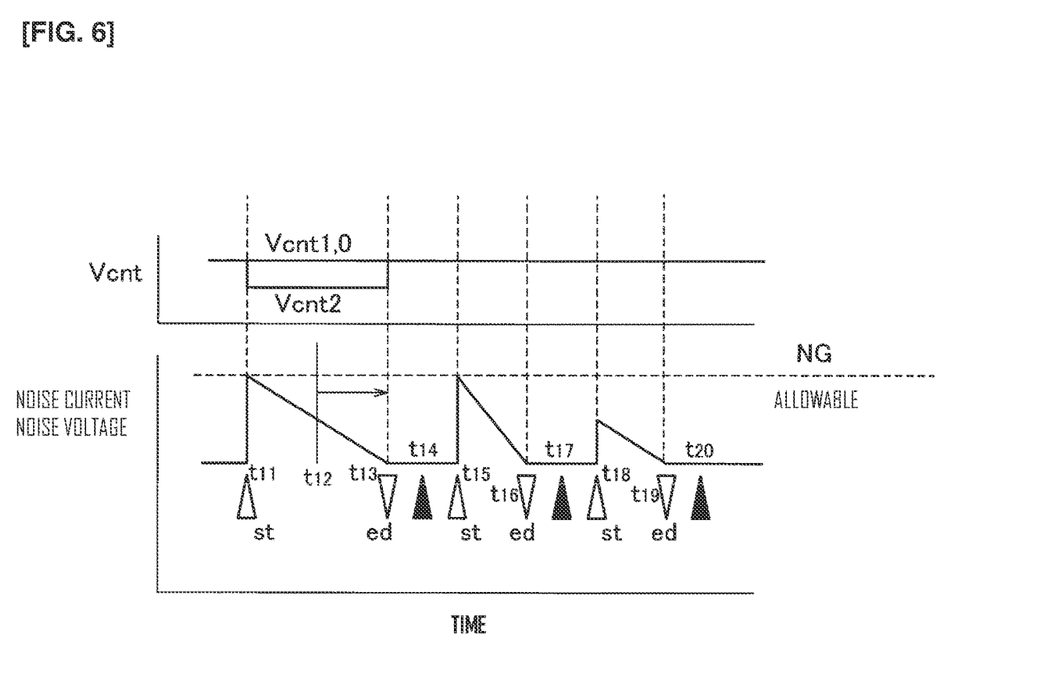
FIG. 6 is a diagram illustrating a temporal alteration of the noise current while a current flowing to the current amount control element is limited when switches are turned on in order of the high-order bits in the bit circuits illustrated in FIG. 5, for example.

Since the setting time of the bit circuit D2 with the limited current (from time t12 to time t13 required to output a correct potential) becomes long, a process to delay the potential comparison time of the bit circuit D2 is conducted. This process has an element to slow down the conversion speed of the A/D conversion circuit. The process only delays the setting time of a bit circuit with the limited current instead of delaying all bit conversions. Therefore, the process has a great advantage over the conventional technology in the case where the solution of the noise problem of the reference power supply is given priority.

The reason why the current is limited to only the current of the bit during the switching period of the bit is explained as follows. Installing the switches sw4, sw3, and sw2 only with the constant current flow may be considered to have the same effect as an A/D conversion circuit according to one or more embodiments when each switch of the CDAC is turned on.

Suppose that the noise current (noise voltage) exceeds the allowable value when the switch sw4 is turned on, and there is no problem when the switches sw3 and sw2 are turned on. Suppose that the on-resistance of the switch sw4 is designed to a value that suppresses the current. This design may be the same as an A/D conversion circuit according to one or more embodiments and may suppress the noise current (noise voltage) caused by the switch sw4 in exchange for increasing the setting time of the bit circuit D2 when the switch sw4 is turned on.

Figure 7:
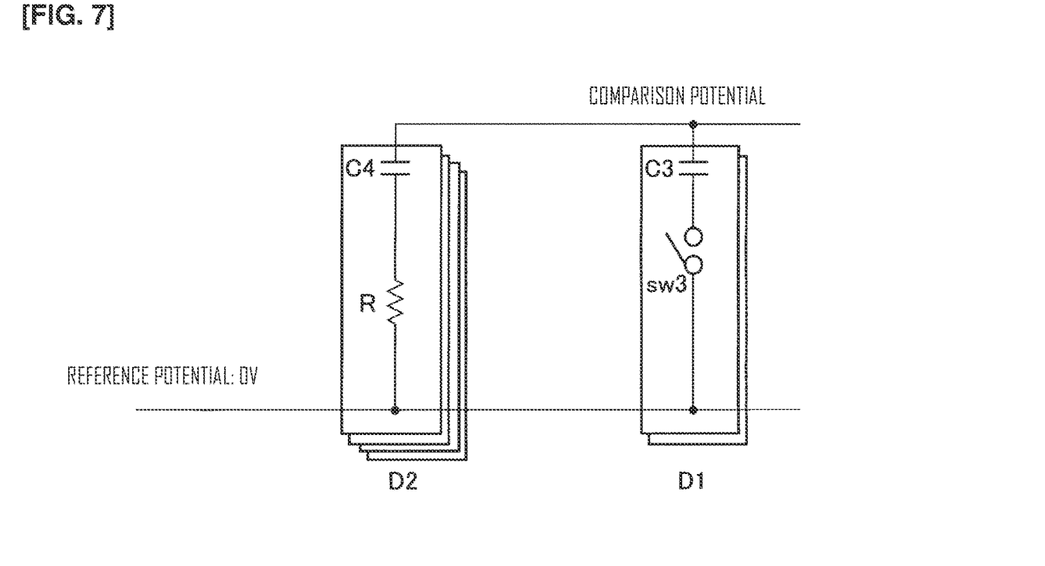
FIG. 7 is a diagram illustrating a problem that occurs when a constant current is applied to turn on each switch in each bit circuit.

The design, however, may have a problem. As illustrated in FIG. 7, if an on-resistance R of the switch sw4 is large, the setting time also becomes large when the switch sw3 or the switch sw2 is turned on and off.

In FIG. 7, in the case where the switch sw3 is turned on to lower the comparison potential, one end of the capacitor C4 may be at the reference potential; however, the existence of the large resistance R causes the potential to temporarily exceed the reference potential. As a result, the comparison potential also temporarily becomes an incorrect value. The condition of the comparison potential temporary becoming an incorrect value is resolved by injecting a charge from the reference potential into one end of the capacitor C4, but it takes time to resolve the problem if the resistance R is large.

Accordingly, increasing the on-resistance of the switch sw4 for the purpose of suppressing the noise current (noise voltage) may increase the setting time when switching the switch sw3 and the switch sw2.

Therefore, according to a first embodiment, the current amount control unit 11 limits the noise current to be less than the allowable value by applying the current control potential to the current amount control element Q4 during the period when the switch sw4 is turned on. The current amount control unit 11 does not limit the current amount of the current amount control element Q4 during the period when the switches sw3 and sw2 are turned on.

As a result, the setting time becomes large only when the current is limited. The A/D conversion circuit that has both the faster conversion time and smaller noise than the conventional technology may be provided by not affecting the setting time when the current is not limited.

Second Embodiment

Figure 8:
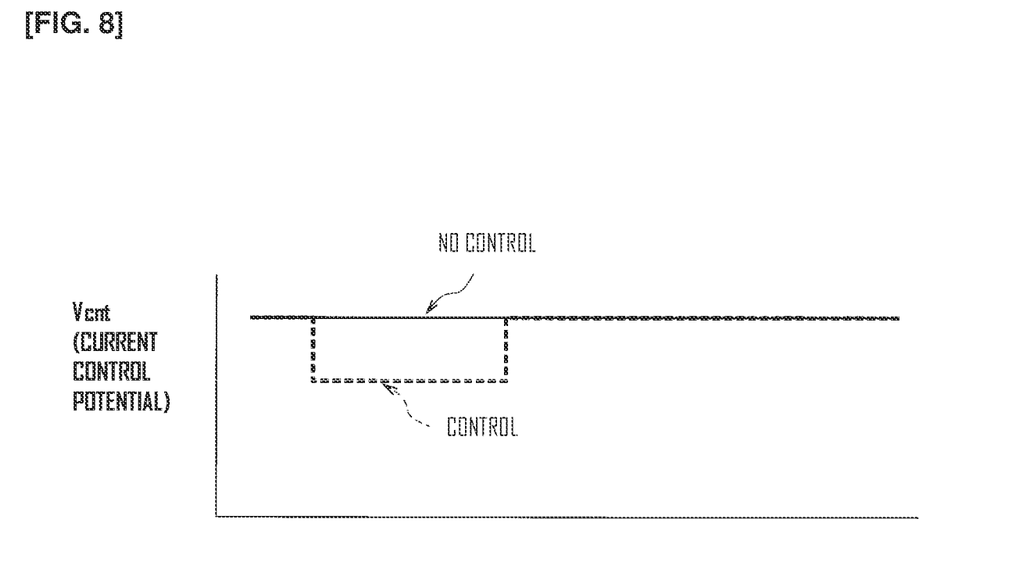

In the A/D conversion circuit according to a first embodiment, the constant current control potential is applied to the current amount control elements Q1 to Q4 to suppress the current during the period when the switch of the CDAC is turned on and the CDAC starts and completes an operation as illustrated in FIG. 8.

Figure 9:
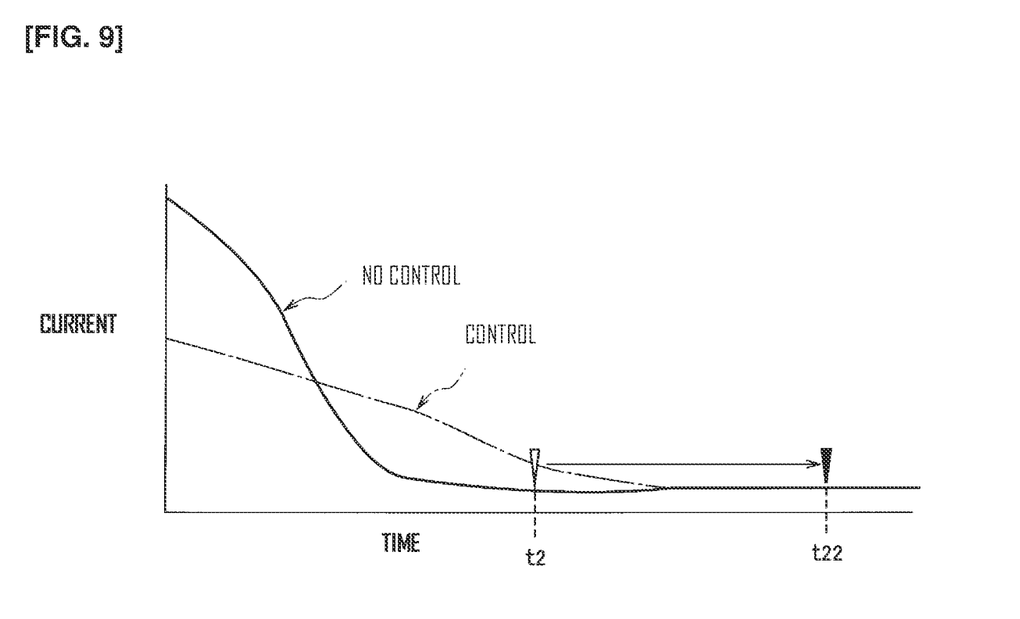
FIG. 9 is a diagram illustrating how setting time becomes longer when the constant current control potential is applied to the current amount control element.

In this case, the current amount control elements Q1 to Q4 behave like resistors and suppress the current. As a result, a large current does not flow, but the time at which the current finishes flowing ends later, which means that the setting time of the CDAC becomes longer as illustrated in FIG. 9.

When the current amount control elements Q1 to Q4 behave like resistors after being turned on, the relationship between the current and time is shaped like a right-angled triangle as illustrated in FIG. 6.

Since a problem to be solved in a second embodiment is to suppress the peak of the noise current (noise voltage), it may be desirable to make the relationship between the current and time be shaped like a rectangle with the same area (amount of charge) but lower height (peak of the current).

Figure 10:
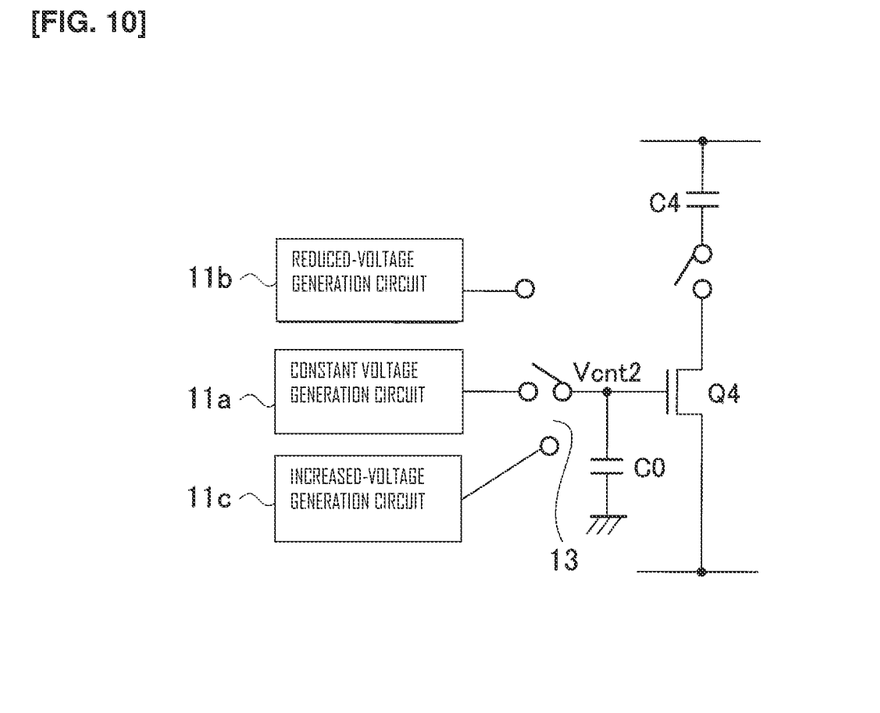
FIG. 10 is a configuration diagram illustrating a main part of the A/D conversion circuit according to a second embodiment.

To solve the above-mentioned problem, an A/D conversion circuit according to a second embodiment comprises a constant voltage generation circuit 11a, a reduced-voltage generation circuit 11b, an increased-voltage generation circuit 11c, and a switch 13 as illustrated in FIG. 10. The constant voltage generation circuit 11a, the reduced-voltage generation circuit 11b, and the increased-voltage generation circuit 11c are provided in the current amount control unit 11. The switch 13 switches and selects the constant voltage generation circuit 11a, the reduced-voltage generation circuit 11b, and the increased-voltage generation circuit 11c.

Figure 11:
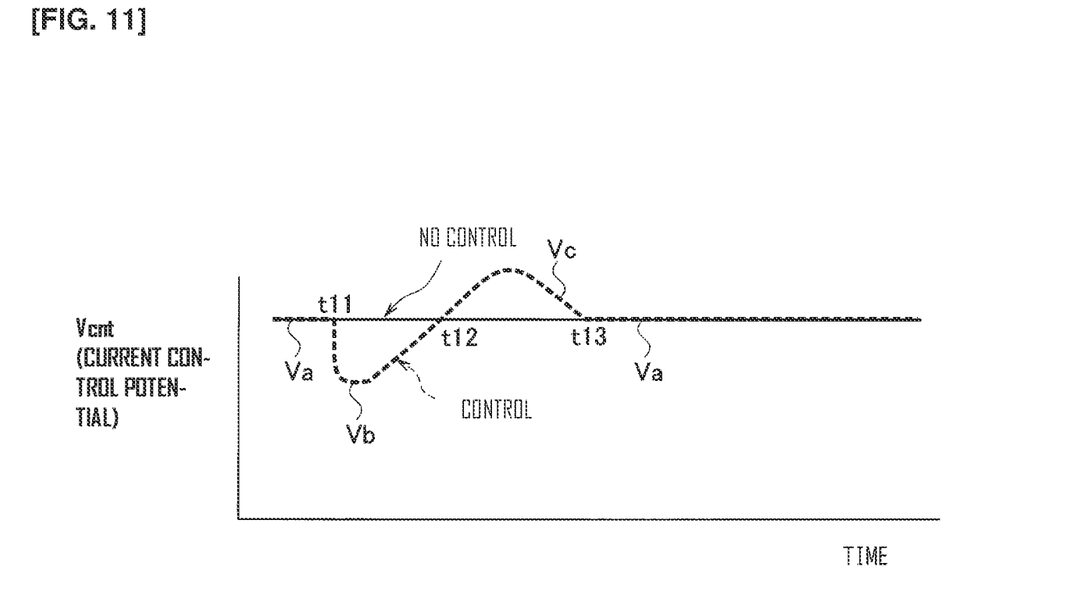
FIG. 11 is a diagram illustrating the current control potential when the current control potential is increased and decreased against a constant value.

The following explains that the peak of the noise current is lowered when the current control potential illustrated in FIG. 11 is applied to the current control element for the noise current forming a right-angled triangle illustrated in FIG. 6.

The constant voltage generation circuit 11a applies a constant current control potential Va illustrated in FIG. 11 to the current amount control element Q4 via the switch 13 before the time t11. At the time t11, the reduced-voltage generation circuit 11b applies a current control potential Vb that is less than the current control potential Va to the current amount control element Q4 via the switch 13.

At the time t12, the increased-voltage generation circuit 11c applies a current control potential Vc that is increased from the current control potential Va to the current amount control element Q4 via the switch 13.

Therefore, the relationship between the current and time becomes a rectangular in shape, and the area (charge amount) is the same, but the height (peak current) is lower.

Figure 12:
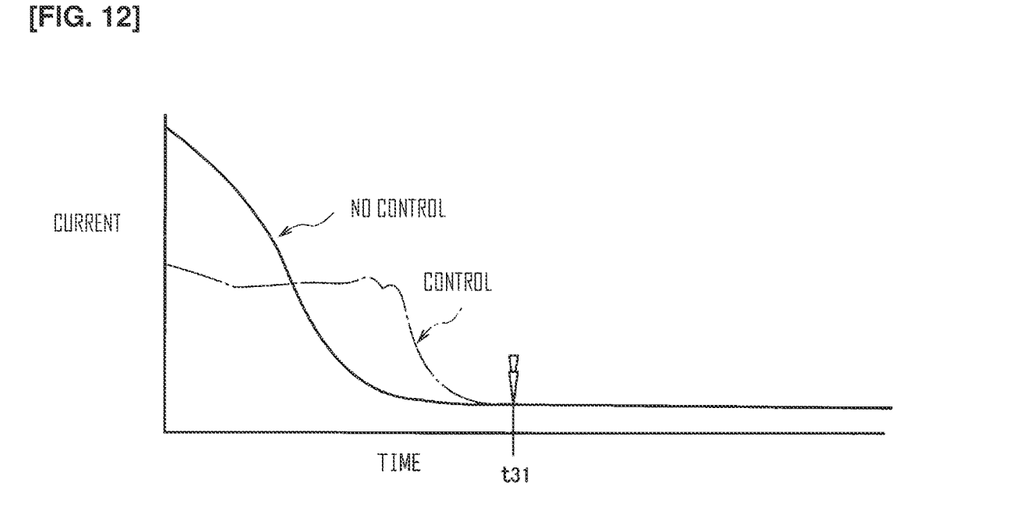
FIG. 12 is a diagram illustrating how setting time becomes shortened when the variable current control potential illustrated in FIG. 11 is applied to the current amount control element.

As illustrated in FIG. 12, the setting time with the current control potential being constant and not being variably controlled and the setting time with the current control potential being variably controlled are approximately the same. Therefore, the setting time of the CDAC, i.e., the conversion time of the A/D conversion circuit, is not decreased, and the A/D conversion circuit with the small noise current (noise voltage) may be realized.

An A/D conversion circuit according to one or more embodiments may limit the noise current below an allowable value by applying a current control potential to a current amount control element in one of bit circuits during the period when a second switch is turned on in one of the bit circuits, in which the noise current is above the allowable value, when the second switch is turned on in each bit circuit by a digital value in order of the high-order bits.

In this way, the A/D conversion circuit according to one or more embodiments may limit the noise current to the reference power supply below the allowable value.

An analog-to-digital converter according to one or more embodiments may include: a capacitor to which the comparison potential is output at one end and whose capacitance value increases as bits become higher from low-order bits to high-order bits; a first switch to which the input potential is applied at the other end of the capacitor; bit circuits in which a series circuit of a second switch and a current amount control element is provided between the other end of the capacitor and the reference power supply in correspondence with the bits; and a current amount control unit which controls the amount of current flowing to the current amount control element provided in each bit circuit of the bit circuits. In one or more embodiments, a current amount control unit may apply a current control potential to the current amount control element in one of the bit circuits to limit a noise current to be less than an allowable value during the period when the second switch in one of the bit circuits, in which the noise current is proportional to a charge flowing from the capacitor to the reference power supply, in the condition that the second switch is turned on in order of the high-order bits in each bit circuit by the digital value.

According to one or more embodiments of the A/D conversion circuit, the noise voltage and error may be reduced.

The A/D conversion circuit according to one or more embodiments may be applicable to the CDAC.

DESCRIPTION OF SIGNS

1: ADC overall control section
10: CDAC
11: Current amount control unit
20: Comparator
30: Sequential comparison data generators
C1 to C4: Capacitors
swA0 to swA4, swH1 to swH4, swL1 to swL4: switches
QH1 to QH4, QL1 to QL4: Current amount control elements
VrefH and VrefL: Reference power supplies

The invention claimed is:

1. An analog-digital conversion circuit for comparing a comparison potential with a reference potential generated based on a reference power supply to convert a comparison potential to a digital value, and outputting the digital value to an analog-to-digital converter, comprising
the analog-to-digital converter that generates the comparison potential based on a potential that is sampled and held input potential, the digital value, and the reference power supply, the analog-to-digital converter comprising:
bit circuits, each bit circuit corresponding to a bit of bits, the bit circuits comprising:
a capacitor that receives the comparison potential from a first terminal, and capacitance value increases from low-order bit to high-order bit of the bits;
a first switch to which the input potential is applied at a second terminal of the capacitor;
a second switch that is electrically connected with the second terminal of the capacitor and the reference power supply; and
a current amount control element; wherein the capacitor, the first switch, the second switch, and the current amount control element are connected in series; and a current amount control unit that controls current amount flowing to the current amount control element in each bit circuit of the bit circuits, wherein in response to second switches of the bit circuits being turned on in order from an upper bit in each bit circuit by the digital value, the current amount control unit applies a current control potential to the current amount control element in any of the bit circuits that a noise current is more than allowable value while the noise current proportional to a charge flowing from the capacitor to the reference power supply is more than the allowable value.

2. The analog-digital conversion circuit according to claim 1, wherein the current amount control unit does not limit the current amount of the current amount control element in one of the bit circuits during a period when the second switch in a bit circuit other than one of the bit circuits is turned on.

3. The analog-digital conversion circuit according to claim 1, wherein the current amount control unit applies a potential to the current amount control element such that a relationship between the noise current and a time becomes a rectangular in shape as the current control potential.

4. The analog-digital conversion circuit according to claim 2, wherein the current amount control unit applies a potential to the current amount control element such that a relationship between the noise current and a time becomes a rectangular in shape as the current control potential.

5. The analog-digital conversion circuit according to claim 3, wherein the current amount control unit applies a current control potential, which is decreased from a constant current control potential, to the current amount control element as the current control potential, and then applies a current control potential, which is increased from the constant current control potential, to the current amount control element.

6. The analog-digital conversion circuit according to claim 4, wherein the current amount control unit applies a current control potential, which is decreased from a constant current control potential, to the current amount control element as the current control potential, and then applies a current control potential, which is increased from the constant current control potential, to the current amount control element.

* * * * *